United States Patent [19]
Landgraf et al.

[11] Patent Number: 5,301,161
[45] Date of Patent: Apr. 5, 1994

[54] CIRCUITRY FOR POWER SUPPLY VOLTAGE DETECTION AND SYSTEM LOCKOUT FOR A NONVOLATILE MEMORY

[75] Inventors: Marc E. Landgraf, Folsom; Jahanshir J. Javanifard, Sacramento; Mark D. Winston, El Dorado Hills, all of Calif.

[73] Assignee: Intel Corporation, Santa Clara, Calif.

[21] Appl. No.: 3,618

[22] Filed: Jan. 12, 1993

[51] Int. Cl.$^5$ .............................................. G11C 13/00
[52] U.S. Cl. .............................. 365/229; 365/189.01; 365/226; 365/900
[58] Field of Search .................. 365/189.01, 226, 227, 365/900, 229

[56] References Cited

U.S. PATENT DOCUMENTS

4,975,883 12/1990 Baker et al. .
5,119,163 6/1992 Ishihara .............................. 365/103

Primary Examiner—Terrell W. Fears
Attorney, Agent, or Firm—Blakely, Sokoloff, Taylor & Zafman

[57] ABSTRACT

A detection circuit is described that resides in a nonvolatile memory that includes a memory array and a control circuitry coupled to the memory array for controlling operations of the memory array. The detection circuit is coupled to the control circuitry and receives a power supply for detecting potential level of the power supply and for generating a reset signal to reset the control circuitry until the potential level of the power supply rises above a predetermined level. The detection circuit includes a resistor, a first, a second, and a third transistor. The first transistor has a first end coupled to receive the power supply, a second end coupled to a first node, and a third end coupled to the first node. The second transistor has a first end coupled to the first node, a second end coupled to ground, and a third end coupled to the ground. The first and second transistors function as a voltage divider. The third transistor has a first end coupled to the power supply, a second end coupled to an output node, and a third end coupled to the first node. The resistor is coupled between the output node and the ground for coupling the output node to the ground when the third transistor is not conducting, and for providing a positive potential at the output node when the third transistor is conducting. When the power supply has not reached the predetermined level, the third transistor is not conducting and the output node outputs the reset signal that is a ground potential. When the power supply rises above the predetermined level, the third transistor starts to conduct and the output node registers the positive potential and ceases generating the reset signal. The first, second, and third transistors are of the same channel type such that the circuitry operates substantially independent of process variations and temperature variations.

22 Claims, 5 Drawing Sheets

CIRCUITRY FOR POWER SUPPLY VOLTAGE DETECTION AND SYSTEM LOCKOUT FOR A NONVOLATILE MEMORY

FIELD OF THE INVENTION

The present invention pertains to the field of computer memories. More particularly, this invention relates to a power supply voltage detection and system lockout circuitry for a nonvolatile memory, wherein the circuitry resets circuitry in the memory until the power supply of the memory reaches a predetermined level.

BACKGROUND OF THE INVENTION

One type of prior EPROM is the flash electrically erasable and programmable read-only memory ("flash EPROM"). The flash EPROM can be programmed by a user, and once programmed, the flash EPROM retains its data until erased. Once programmed, the contents of the flash EPROM can be erased by electrical erasure. The flash EPROM may then be reprogrammed with new code or data.

When a computer system to which a prior flash EPROM is coupled goes through a power up or power down transition, the system level signals such as the power supply voltage $V_{CC}$ or the program/erase voltage $V_{PP}$ are typically not guaranteed to be valid. This means that the potential level of the $V_{CC}$ voltage or the $V_{PP}$ voltage may be below a minimum operation voltage required for the prior flash EPROM during power up or power down transitions. The invalid $V_{CC}$ or $V_{PP}$ signals may cause circuitry of the prior flash EPROM to malfunction and may result in data corruption or physical damage to the prior flash EPROM is typically a result of over-erasing or over-programming. An over-erasing condition arises because too much charge is removed from the floating gate, making the flash EPROM "depletion-like."

One prior art circuit locks out the circuitry of the prior flash EPROM when the system level signals are not valid so as to prevent false operations on the prior flash EPROM. That prior art circuit is referred to in U.S. Pat. No. 4,975,883, issued Dec. 4, 1990, and entitled METHOD AND APPARATUS FOR PREVENTING THE ERASURE AND PROGRAMMING OF A NONVOLATILE MEMORY. That prior art circuit includes a reference voltage generation circuit and a comparator circuit. The reference voltage generation circuit generates a reference voltage that corresponds to the minimum operation voltage required for the prior flash EPROM. The power supply voltage $V_{CC}$ is then compared in the comparator circuit with the reference voltage. If the voltage level of the power supply voltage $V_{CC}$ is not above that of the reference voltage, the comparator circuit outputs a signal that forces the prior flash EPROM into a read mode.

One disadvantage associated with this prior art circuit is that the circuit typically requires the power supply voltage $V_{CC}$ to be higher than 3 volts. Given that three or more transistors are typically connected together in one branch, this prior art circuit cannot typically function properly when the power supply $V_{CC}$ voltage is below 3 volts. This means that the prior art circuit typically is not used in a 3 volt power supply environment. This drawback is not trivial given that many laptop computers employ a 3 volt power supply.

Another disadvantage associated with this prior art circuit is that it employs a relatively large number of transistors. Thus, the prior art circuit is relatively complex and it occupies a relatively large amount of space on a substrate.

In addition, the prior art circuit also consumes a relatively large amount of power because of the relatively large number of transistors. Power consumption in a computer system is exceptionally critical when the computer system is a battery-powered portable unit, such as a laptop computer. It is typically desirable that a portable computer system consume a minimum amount of power in order to prolong battery life.

SUMMARY AND OBJECTS OF THE INVENTION

One of the objects of the present invention is to provide circuitry for power supply voltage detection and system lockout for a nonvolatile memory, wherein other circuitry of the memory is reset until the power applied to the memory reaches a predetermined level.

Another object of the present invention is to provide circuitry for power supply voltage detection and system lockout for a nonvolatile memory, wherein the potential of the power supply is approximately 3 volts.

Another object of the present invention is to provide circuitry for power supply voltage detection and system lockout for a nonvolatile memory, wherein the structure of the circuitry for power supply voltage detection and system lockout is simplified and the power consumption of that circuitry is minimized.

Another object of the present invention is to provide circuitry for power supply voltage detection and system lockout for a nonvolatile memory, wherein that circuitry operates substantially independently of temperature variations and process variations.

A further object of the present invention is to provide circuitry for power supply voltage detection and system lockout for a nonvolatile memory, wherein the trip point voltage at which that circuitry switches is adjustable to detect different power supply potentials.

A nonvolatile memory is described that includes (1) a memory array, (2) a control circuitry coupled to the memory array for controlling operations of the memory array, and (3) a detection circuit coupled to the control circuitry and coupled to receive a power supply for detecting potential level of the power supply and for generating a reset signal to reset the control circuitry until the potential level of the power supply rises above a predetermined level. The detection circuit further includes a resistor, a first transistor, a second transistor, and a third transistor. The first transistor has a first end coupled to receive the power supply, a second end coupled to a first node, and a third end coupled to the first node. The second transistor has a first end coupled to the first node, a second end coupled to ground, and a third end coupled to ground. The first and second transistors function as a voltage divider. The third transistor has a first end coupled to the power supply, a second end coupled to an output node, a third end coupled to the first node. The resistor is coupled between the output node and the ground for coupling the output node to the ground when the third transistor is not conducting, and for providing a positive potential at the output node when the third transistor is conducting. When the power supply has not reached the predetermined level, the third transistor is not conducting and the output node outputs the reset signal that is a ground potential. When the power supply rises above the predetermined level, the third transistor starts to conduct and the output node registers the positive potential and ceases generating the reset signal. The first, second, and third transistors are of the same channel type such that the circuitry operates substantially independent of process variations and temperature variations.

A detection circuit of a nonvolatile memory is described. The memory includes a memory array and a control circuitry coupled to the memory array for controlling operations of the memory array. The detection circuit is coupled to the control circuitry and receives a power supply for detecting potential level of the power supply and for generating a reset signal to reset the control circuitry until the potential level of the power supply rises above a predetermined level. The detection circuit includes a resistor, a first transistor, a second transistor, and a third transistor. The first transistor has a first end coupled to receive the power supply, a second end coupled to a first node, and a third end coupled to the power supply. The second transistor has a first end coupled to the first node, a second end coupled to ground, and a third end coupled to first node. The first and second transistors function as a voltage divider. The third transistor has a first end coupled to an output node, a second end coupled to ground, a third end coupled to the first node. The resistor is coupled between the output node and the power supply for providing a positive potential at the output node when the third transistor is not conductive. When the power supply has not reached the predetermined level, the third transistor is not conducting and the output node outputs the reset signal that is the positive potential. When the power supply rises above the predetermined level, the third transistor starts to conduct and the output node registers a ground potential and ceases to output the reset signal. The first, second, and third transistors are of the same channel type such that the circuitry operates substantially independent of process variation and temperature variation.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
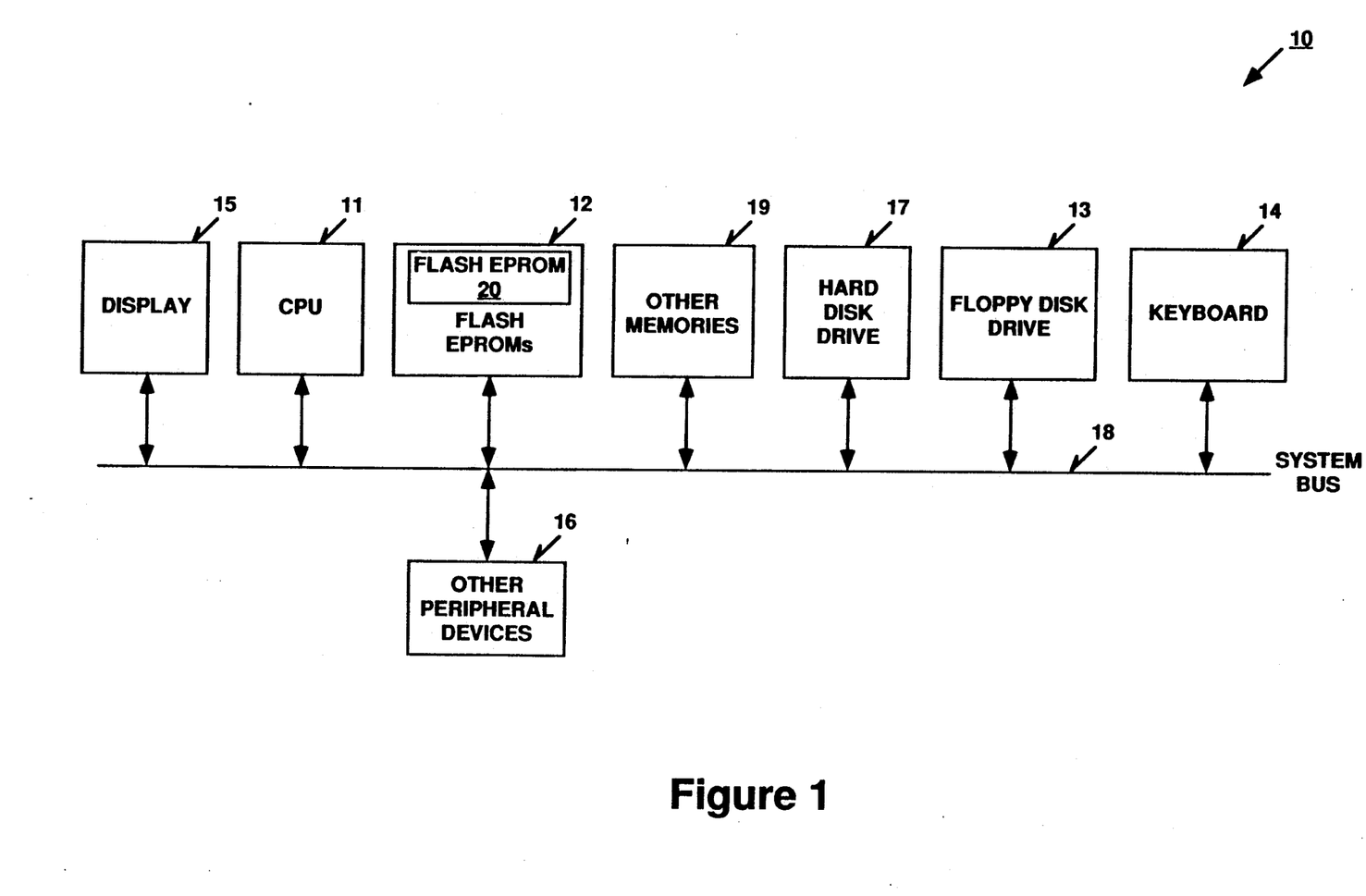
FIG. 1 is a block diagram of a computer system that includes a CPU and flash EPROMs.

FIG. 1 schematically illustrates in block diagram form the architecture of a microprocessor-based computer system 10 that includes flash EPROMs 12, each of which implements an embodiment of the present invention.

Figure 2:
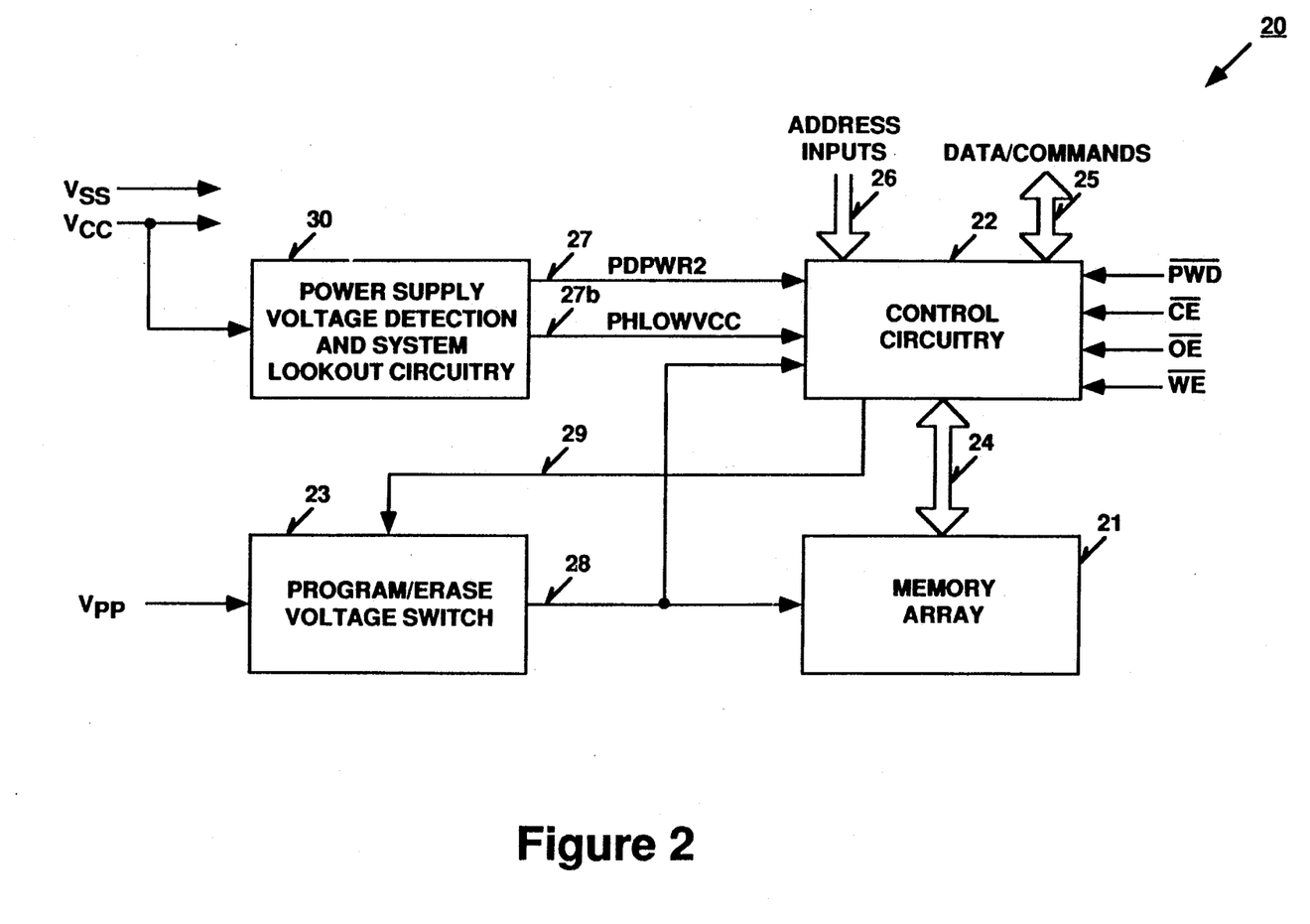
FIG. 2 is a block diagram of the layout of a flash EPROM that is used in the computer system of FIG. 1, including circuitry for power supply voltage detection and system lockout.

FIG. 2 illustrates in block diagram form the circuitry of flash EPROM 20, which is one of flash EPROMs 12 of FIG. 1. Flash EPROM 20 includes a memory array 21, control circuitry 22 for controlling the operation of memory array 21, and a program/erase voltage switch 23 for applying a program/erase voltage $V_{PP}$ to memory array 21 and control circuitry 22.

As will be described in more detail below, flash EPROM 20 includes circuitry for power supply voltage detection and system lockout for detecting the potential level of the power supply and for generating a reset signal to reset control circuitry until the potential level of the power supply rises above a predetermined level.

Referring to FIG. 1, computer system 10 for one embodiment is a personal computer system. For alternative embodiments, computer system 10 comprises a portable computer, a workstation, a minicomputer, a mainframe, or any other type of computer.

Computer system 10 includes a central processing unit ("CPU 11"). For one embodiment, CPU 11 includes a microprocessor, a coprocessor, a cache, and a cache controller for handling access to the cache by the microprocessor. For alternative embodiments, more or fewer elements than those mentioned above may be included in CPU 11. For example, CPU 11 may only include the microprocessor. For one embodiment, the elements mentioned above may reside on a single semiconductor substrate. For one embodiment, CPU 11 comprises an i486 ™ microprocessor sold by Intel corporation of Santa Clara, Calif.

CPU 11 is coupled to a system bus 18 of computer system 10. System bus 18 is used in computer system 10 as the backplane bus for transfer of data among various components of computer system 10.

For one embodiment, system bus 18 is an Industry Standard Architecture ("ISA") bus. For an alternative, embodiment, bus 18 is an Extended Industry Standard Architecture ("EISA") bus.

Computer system 10 includes flash EPROMs 12. Flash EPROMs 12 are coupled to system bus 18. Flash EPROMs 12 include a plurality of separately packaged flash EPROMs, including flash EPROM 20. Flash EPROMs 12 are accessed by CPU 11 via system bus 18. Flash EPROMs 12 store programs and data for computer system 10.

Computer system 10 also includes other memories 19 that are coupled to system bus 18. Other memories 19 of computer system 10 are accessed by CPU 11 via system bus 18. Other memories 19 may include random access memories ("RAMs"), read only memories ("ROMs"), EPROMs, or other type of memories.

Computer system 10 also includes a floppy disk drive 13, a keyboard 14, a display 15, and a hard disk drive 17 coupled to system bus 18. Keyboard 14 is used to input data into computer system 10. Keyboard 14 also includes a cursor control device, such as a mouse or a trackball. Display 15 is used to illustrate data of computer system 10. Floppy disk drive 13 is used to send and receive data and programs. Hard disk drive 17 is used for application and data bulk storage. Hard disk drive 17 also includes a disk drive controller.

Computer system 10 also includes other peripheral devices 16 that are connected to system bus 18. These other peripheral devices include a modem, a serial communication controller, a local area network ("LAN"), and a parallel communication controller. The LAN couples computer system 10 that includes into a network other computer systems. The parallel communication controller is coupled to a printer. The parallel communication controller controls access to the printer.

Referring to FIG. 2, memory array 21 of flash EPROM 20 is made up of memory cells that store data at addresses. As described above, flash EPROM 20 is one of flash EPROMs 12 of FIG. 1. For one embodiment, memory array 21 stores 4 Mbits ("megabits") of data. For another embodiment, memory array 21 stores 8 Mbits of data. For alternative embodiments, memory array 21 can be smaller than 4 Mbits or larger than 8 Mbits.

For one embodiment, memory array 21 is organized into bit line blocks by arranging bit lines into groups. For another embodiment, memory array 21 is organized into word line blocks by arranging word lines into groups.

For one embodiment, all the circuitry of flash EPROM 20 on a single substrate and flash EPROM 20 employs MOS circuitry.

Control circuitry 22 of flash EPROM 20 controls the device operations with respect to memory array 21 via bus 24. The device operations typically include read, programming, and erasure operation. Control circuitry 22 also receives data read from memory array 21 and applies data to be written to memory array 21 via bus 24. Control circuitry 22 includes address decoding circuitry, write state circuitry, and command state circuitry (not shown). The address decoding circuitry of control circuitry 22 accesses the memory locations of memory array 21 at the addresses supplied to flash EPROM 20. The write state circuitry regulates the device operations of flash EPROM 20 after an initiating command from CPU 11. The command is applied to the command state circuitry. The command state circuitry decodes the command and generates the appropriate control signals to the write state circuitry.

Addresses are applied to flash EPROM 20 via address bus 26. Data is applied to and received from flash EPROM 20 via data bus 25. The device operation commands are also applied to flash EPROM 20 via data bus 25.

$V_{PP}$ is the program/erase power supply voltage for flash EPROM 20. $V_{PP}$ is applied to a $V_{PP}$ pin of flash EPROM 20. $V_{PP}$ is coupled to program/erase voltage switch 23. During programming and erasing of flash EPROM 20, program/erase voltage switch 23 passes the $V_{PP}$ potential to memory array 21 and control circuitry 22. For one embodiment, $V_{PP}$ should be approximately 12 volts.

$V_{CC}$ is the device power supply for flash EPROM 20 and $V_{SS}$ is ground. $V_{CC}$ is applied to a $V_{CC}$ pin of flash EPROM 20 and $V_{SS}$ is applied to a $V_{SS}$ pin of flash EPROM 20. For one embodiment, $V_{CC}$ should be approximately 3 volts or at least above the minimum operation voltage, as described in more detail below. For another embodiment, $V_{CC}$ should be approximately 5 volts.

As described in more detail below, circuitry 30 for power supply voltage detection and system lockout detects the level of $V_{CC}$ that is applied to flash EPROM 20.

Flash EPROM 20 includes three control signals coupled to control circuitry 22—namely, chip enable $\overline{CE}$, output enable $\overline{OE}$, and write enable $\overline{WE}$. Chip enable input $\overline{CE}$ is the power control and is used for device selection of flash EPROM 20. The output enable input $\overline{OE}$ is the output control for flash EPROM 20 and is used to gate data from the output pins from flash EPROM 20, dependent on device selection. Both of the control functions $\overline{CE}$ and $\overline{OE}$ must be logically active to obtain data at the outputs of flash EPROM 20. When the enable pin $\overline{CE}$ is high (at the $V_{CC}$ voltage), flash EPROM 20 enters a standby mode. In the standby mode, power consumption by flash EPROM 20 is reduced.

The write enable signal $\overline{WE}$ allows writes to control circuitry 22 while chip enable input $\overline{CE}$ is active low. Write enable signal $\overline{WE}$ is active low. Addresses and data are latched on the rising edge of the write enable $\overline{WE}$ signal. Standard microprocessor timings are used.

Flash EPROM 20 also includes a $\overline{PWD}$ pin. The $\overline{PWD}$ pin is coupled to control circuitry 22. The $\overline{PWD}$ pin supplies a $\overline{PWD}$ control signal to control circuitry 22. The $\overline{PWD}$ control signal is an active low power down control signal. A logically low $\overline{PWD}$ control signal causes flash EPROM 20 to enter the power down mode. As described above, when flash EPROM 20 enters the power down mode, all circuits of flash EPROM 20 are powered off. When the $\overline{PWD}$ control signal supplied at the $\overline{PWD}$ pin raises to the $V_{CC}$ voltage (i.e., logical high), flash EPROM 20 returns to its normal operational modes.

For an alternative embodiment, the $\overline{PWD}$ control signal applied at the $\overline{PWD}$ pin of flash EPROM 20 may also include a $V_{PP}$ voltage signal (i.e., a high voltage signal).

In absence of the high $V_{PP}$ potential on the $V_{PP}$ input pin to flash EPROM 20, EPROM 20 acts as a read-only memory. The data stored at an address supplied via address bus 26 is read from memory array 21 and made available through control circuitry 22 and buses 24 and 25 to CPU 11.

Device operations of flash EPROM 20, such as read, programming, and erasure, are selected by writing specific commands into control circuitry 22 via data bus 25. The commands may include an erase set-up command, an erase confirm command, a program set-up command, a program command, and a read command. While $V_{PP}$ is high for erasure and programming, memory array 21 can be accessed via the read command as well.

The programming and erasure operations are regulated by the write state circuitry of control circuitry 22 internally, including program pulse repetition where required and internal verification and margin of data. This is also referred to as internal write automation.

Commands to program or erase memory array 21 are applied to control circuitry 22 via data bus 25 and are decoded in control circuitry 22. Control circuitry 22 then latches in the necessary addresses and data needed to complete the operations from address bus 26 and data bus 25, respectively. Control circuitry 22 then controls program/erase voltage switching 23 via line 29 to apply the $V_{PP}$ voltage to memory array 21 via line 28.

Flash EPROM 20 has a minimum operation voltage. When the actual $V_{CC}$ voltage supplied to flash EPROM 20 is below the minimum operation voltage, all input signals are considered invalid and most of the circuitry of the memory cannot function properly.

Flash EPROM 20 includes circuitry 30 for power supply voltage detection and system lockout. Circuitry 30 detects the voltage level of the actual $V_{CC}$ voltage applied to the $V_{CC}$ pin of flash EPROM 20 and locks out flash EPROM 20 when the actual applied voltage level of the $V_{CC}$ voltage is below the minimum operation voltage specified for flash EPROM 20.

Circuitry 30 for power supply voltage detection and system lockout receives the power supply voltage $V_{CC}$ and provides a reset output signal PDPWR2 to control circuitry 22 via line 27. The reset output signal PDPWR2 from power supply voltage detection and system lockout circuitry 30 is an active logical high signal that, when in high, resets control circuitry 22, which in turn locks out entire flash EPROM 20. When the reset PDPWR2 signal goes to logical low, control circuitry 22 exits from its reset state and flash EPROM 20 resumes the normal operations.

Circuitry 30 for power supply voltage detection and system lockout also generates an array protection signal PHLOWVCC that is sent to control circuitry 22 via line 27b. The PHLOWVCC signal, when active, prevents control circuitry 22 from programming or erasing memory array 21.

Power supply voltage detection and system lockout circuitry 30 generates the PDPWR2 reset signal and the array protection PHLOWVCC signal in accordance with the voltage level of the power supply voltage $V_{CC}$ that is applied to flash EPROM 20. Power supply voltage detection and system lockout circuitry 30 detects the voltage level of the supplied $V_{CC}$ voltage in order to output the PDPWR2 and PHLOWVCC signals. Circuitry 30 has a trip point voltage $V_{TP}$ at which the output of circuitry 30 flips. When the voltage level of the $V_{CC}$ voltage is below the trip point voltage $V_{TP}$ of circuitry 30, circuitry 30 generates the logical high PDPWR2 signal that resets control circuitry 22. In addition, the array protection signal PHLOWVCC is also generated to prevent memory array 21 from being programmed or erased. When the voltage level of the $V_{CC}$ voltage has risen above the trip point voltage $V_{TP}$ of circuitry 30, circuitry 30 outputs the logical low PDPWR2 signal that causes control circuitry 22 to leave the reset state. The array protection PHLOWVCC signal is also deasserted.

As described above, the trip point voltage $V_{TP}$ is a voltage level at which circuitry 30 switches its output from one state to the other. For one embodiment, circuitry 30 allows the trip point voltage to be approximately 2.5 volts. For alternative embodiments, the trip point is approximately 2 volts or somewhere in the range of 2.0 volts to 2.5 volts. For other alternative embodiments, the trip point voltage of circuitry 30 is adjustable by changing the sizes of the transistors employed in the circuitry.

The trip point voltage $V_{TP}$ of circuitry 30 corresponds to the minimum operation voltage specified for flash EPROM 20.

The low trip point voltage $V_{TP}$ of circuitry 30 allows circuitry 30 to detect a low voltage power supply.

When circuitry 30 outputs a logical high PDPWR2 signal, the voltage level of the logical high PDPWR2 signal is approximately equal to that of the $V_{CC}$ voltage. When circuitry 30 outputs a logical low PDPWR2 signal, the voltage level of the low PDPWR2 signal is ground. The relationship of the output PDPWR2 signal of circuitry 30 with the power supply $V_{CC}$ voltage is illustrated in FIG. 3.

Figure 3:
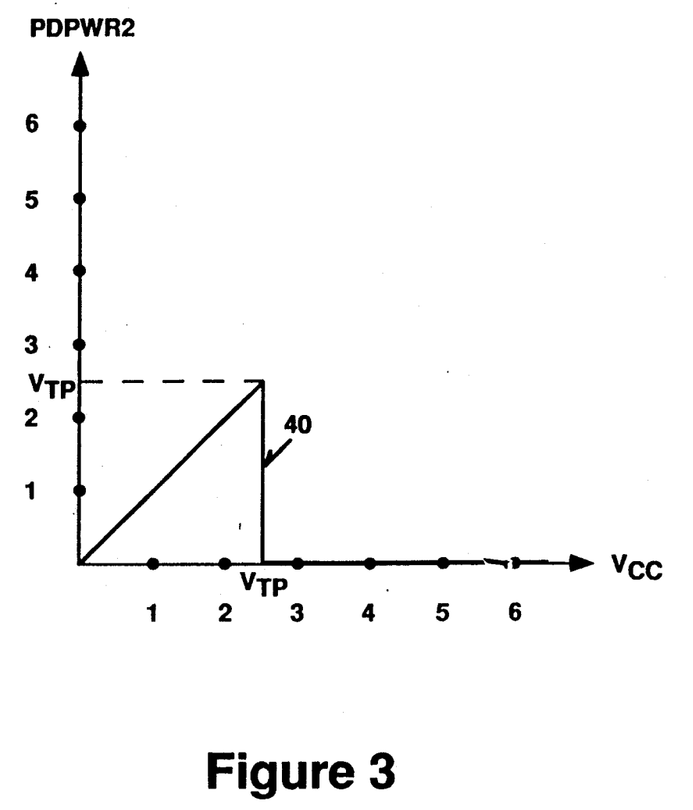
FIG. 3 is a graphical representation showing the relationship of the output and input signals of the circuitry of FIG. 2 for power supply voltage detection and system lockout.

As can be seen from FIG. 3, when $V_{CC}$ rises, the voltage level of the PDPWR2 signal rises accordingly. When $V_{CC}$ rises to the trip point voltage $V_{TP}$ of circuitry 30, circuitry 30 switches, causing its output signal PDPWR2 to fall to ground.

Therefore, power supply voltage detection and system lockout circuitry 30 locks out control circuitry 22 and thus the entire flash EPROM when the level of the actual $V_{CC}$ voltage that is applied to the flash EPROM 20 is below the minimum operation voltage of flash EPROM 20. Below the minimum operation voltage, the input signals of flash EPROM 20 are considered to be invalid and the circuitry of flash EPROM 20 may not function properly. As described above, the minimum operation voltage is equal to the point voltage $V_{TP}$ of circuitry 30. The circuitry of power supply voltage detection and system lockout circuitry 30 is described in more detail below in conjunction with FIGS. 3 through 5.

Figure 4:
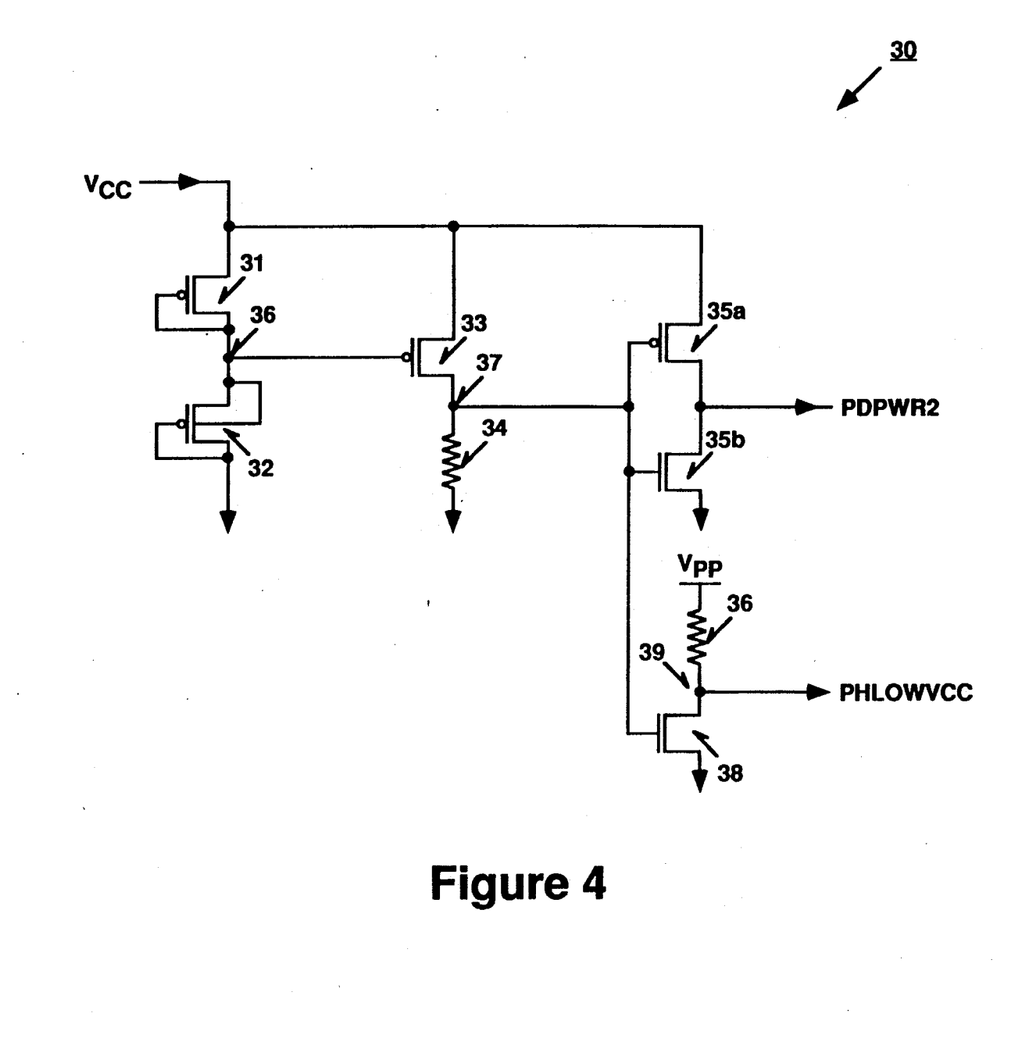
FIG. 4 is a circuit diagram of the circuitry shown in FIG. 2 for power supply voltage detection and system lockout.

Referring to FIG. 4, the circuitry of power supply voltage detection and system lockout circuitry 30 is illustrated. As shown in FIG. 4, circuitry 30 includes P-channel transistors 31 through 33 and a resistor 34. Transistors 31-33 of circuitry 30 are the same type of transistors so as to allow circuitry 30 to be substantially independent of process variations and temperature variations.

Transistors 31 and 32 are coupled together as a voltage divider. The source of transistor 31 is coupled to receive the $V_{CC}$ voltage. The gate and drain of transistor 31 are connected to a node 36. The source of transistor 32 is also connected to node 36. The gate and drain of transistor 32 are connected to the ground. The substrate (well) of transistor 32 is connected to node 36. This ensures that the voltage divider output generated by transistors 31 and 32 is linear. Transistor 33 has its gate connected to node 36. The source of transistor 33 is connected to the $V_{CC}$ voltage. The drain of transistor 33 is connected to an output node 37. Resistor 34 is connected between output node 37 and the ground. Output node 37 then generates the PDPWR2 reset signal through an inverter comprised of a P-channel transistor 35a and an N-channel transistor 35b.

For one embodiment, transistors 31 and 32 are of same size. For alternative embodiments, transistors 31 and 32 have different size ratios.

During operation, because transistors 31 and 32 are connected to be always on, node 36 registers a voltage that is proportional to the voltage level of the $V_{CC}$ voltage. Initially, the voltage level of the $V_{CC}$ voltage is at ground level and circuitry 30 is not operational. Transistor 33 is off and output node registers a ground potential. When the $V_{CC}$ voltage starts to rise, the voltage level at node 36 rises accordingly. Transistor 33, however, remains off when the voltage level at node 36 does not exceed the threshold voltage of transistor 33. At this time, output node 37 still registers the ground potential, which in turn, keeps N-channel transistor 35b of the inverter off. The voltage level of the PDPWR2 signal tracks that of the $V_{CC}$ voltage through P-channel transistor 35a. The waveform of PDPWR2 signal is shown in FIG. 3.

When the $V_{CC}$ voltage reaches the trip point voltage $V_{TP}$ of circuitry 30, the potential difference between the $V_{CC}$ voltage and the voltage registered at node 36 rises to the threshold of transistor 33. Transistor 33 is then turned on by the voltage at node 36. This causes the voltage level at output node 37 to pull up to the $V_{CC}$ voltage. This $V_{CC}$ voltage at output node 37 then turns on transistor 35b and shuts off transistor 35a, causing the PDPWR2 signal to drop to ground potential (see FIG. 3).

Output node 37 is also connected to a level shift circuit formed by a resistor 36 and an N-channel transistor 38. The reset signal at output node 37 also controls the level shift circuit to generate the array protection signal PHLOWVCC at its output node 39. The PHLOWVCC signal is sent to control circuitry 22 of FIG. 2. The PHLOWVCC signal is generated when the $V_{CC}$ voltage is below the minimum operation voltage. As can be seen from FIG. 4, when output node 37 registers the ground potential, the level shift circuit generates the array protection PHLOWVCC signal which is the $V_{PP}$ voltage. When output node 37 registers the $V_{CC}$ voltage, the level shift circuit deasserts the PHLOWVCC signal to ground potential.

The size ratio of transistors 31 and 32 can be changed so as to shift the trip point voltage $V_{TP}$ of circuitry 30 up or down. For example, when the size ratio of transistors 31–32 is changed to 1 to 4 and the threshold voltage of transistor 33 is 1 volt, transistor 33 is not conducting until the $V_{CC}$ voltage rises above 5 volts. This therefore shifts the trip point voltage $V_{TP}$ to 5 volts.

As can be seen from FIG. 4, power supply voltage detection and system lockout circuitry 30 requires only three transistors 31–33 and one resistor 34 to function as a voltage detection and system lockout circuit. In addition, the power consumption of the circuit is minimized given that few circuit elements are used in circuitry 30. Moreover, because transistors 31–33 are the same type of transistors, circuitry 30 operates substantially independent of process and temperature variations. Furthermore, circuitry 30 can operate in a low power supply environment.

Figure 5:
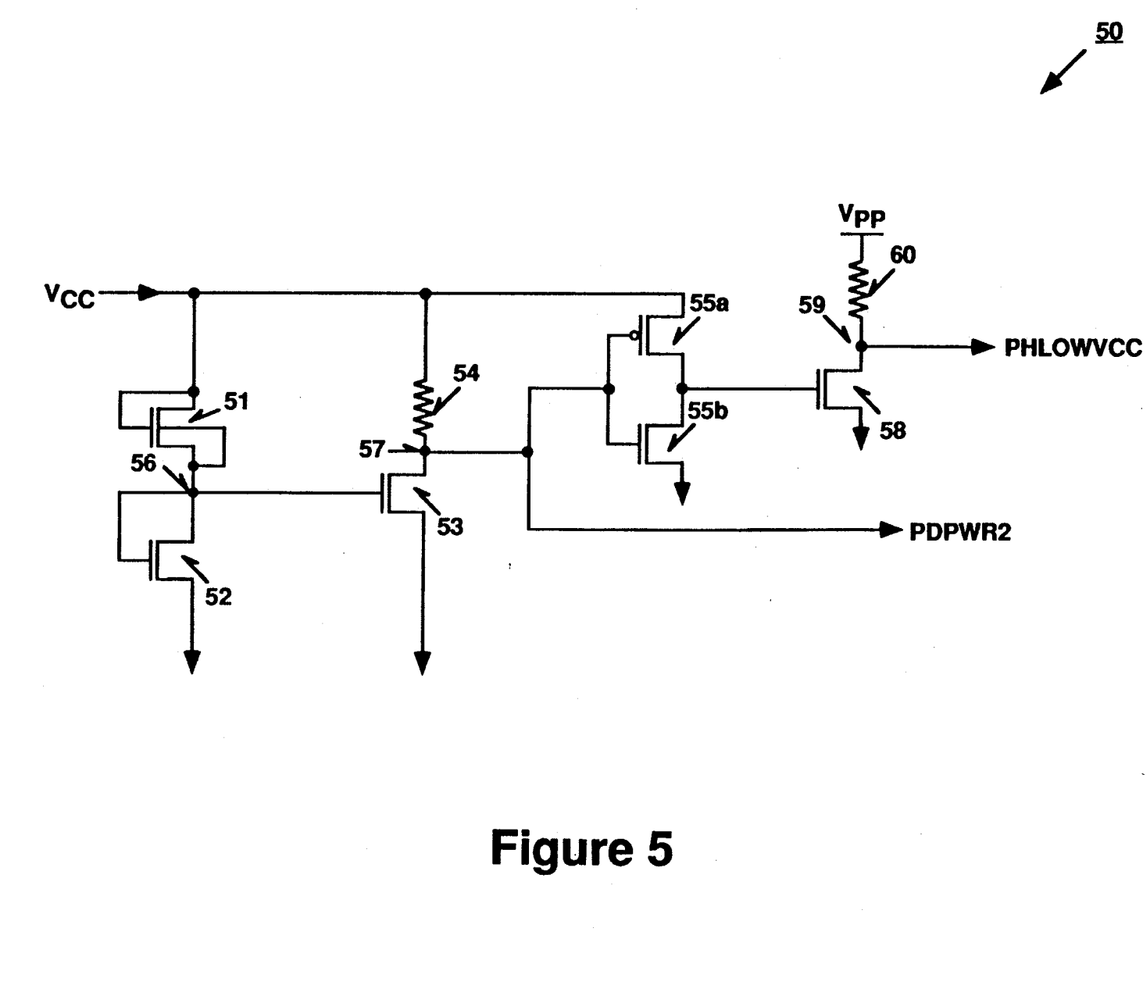
FIG. 5 is another circuit diagram of an alternative embodiment of the circuitry of FIG. 2 for power supply voltage detection and system lockout.

FIG. 5 illustrates a power supply voltage detection and system lockout circuitry 50 that is an alternative embodiment with respect to circuitry 30 of FIG. 2. As shown in FIG. 5, circuitry 50 includes N-channel transistors 51–53 instead of P-channel transistors. Circuitry 50 also includes a resistor 54. Transistors 51–53 are the same type of transistors so as to allow circuitry 50 to be substantially independent of process variations and temperature variations.

Transistors 51 and 52 are coupled together to form a voltage divider. The drain and gate of transistor 51 are coupled to receive the $V_{CC}$ voltage. The source of transistor 51 is connected to a node 56. The substrate of transistor 51 is connected to node 56. This ensures that the voltage divider output generated by transistors 51 and 52 is approximately linear. Transistor 52 has its drain and gate connected to node 56, and transistor 52 has its source connected to ground.

Transistor 53 has its drain connected to an output node 57, its source to ground, and its gate to node 56. Resistor 54 is connected between the $V_{CC}$ voltage and output node 57. Output node 57 then generates the PDPWR2 signal.

For one embodiment, transistors 51 and 52 are of same size. For alternative embodiments, transistors 51 and 52 have different size ratios.

During operation, transistor 53 is off when the voltage level at node 56 does not exceed the threshold voltage of transistor 53. At this time, output node 57 registers the $V_{CC}$ voltage via resistor 54.

When the $V_{CC}$ voltage reaches the trip point voltage $V_{TP}$ of circuitry 50, the voltage level at node 56 rises to the threshold of transistor 53. Transistor 53 is thus turned on, which grounds output node 57. This causes the PDPWR2 signal to drop to ground potential.

The size ratio of transistors 51 and 52 can be changed so as to shift the trip point voltage $V_{TP}$ of circuitry 50.

The reset PDPWR2 signal at output node 57 is also connected to a level shift circuit formed by a resistor 60 and an N-channel transistor 58 to generate the array protection signal PHLOWVCC. When output node 57 registers a $V_{CC}$ voltage that is below the minimum operation voltage, the level shift circuit generates the PHLOWVCC signal. When output node 57 registers the ground potential, the level shift circuit deasserts the PHLOWVCC signal.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuitry in a nonvolatile memory for detecting a potential level of a power supply applied to the nonvolatile memory and for generating a reset signal to reset resettable circuitry in the nonvolatile memory until the potential level of the power supply rises above a predetermined voltage level, comprising:
   (A) a first transistor having a first end coupled to receive the power supply, a second end coupled to a first node, and a third end coupled to the first node;
   (B) a second transistor having a first end coupled to the first node, a second end coupled to ground, and a third end coupled to the ground, wherein the first and second transistors function as a voltage divider;
   (C) a third transistor having a first end coupled to the power supply, a second end coupled to an output node, a third end coupled to the first node; and
   (D) resistor means coupled between the output node and the ground for coupling the output node to the ground when the third transistor is not conducting, and for providing a positive potential at the output node when the third transistor is conducting, wherein when the power supply has not reached the predetermined voltage level, the third transistor is not conducting and the output node outputs the reset signal that is a ground potential, wherein when the power supply rises above the predetermined voltage level, the third transistor starts to conduct and the output node registers the positive potential and ceases generating the reset signal, wherein the first, second, and third transistors are of the same channel type such that the circuitry operates substantially independent of process variations and temperature variations.

2. The circuitry of claim 1, wherein each of the first, second, and third transistors has a threshold voltage of approximately one volt.

3. The circuitry of claim 2, wherein the predetermined voltage level can be changed by changing size ratio of the first and second transistors.

4. The circuitry of claim 1, wherein the first, second, and third transistors are P-channel transistors.

5. The circuitry of claim 1, further comprising an inverter coupled to the output node.

6. The circuitry of claim 1, wherein the resistor means comprises a diffusion resistor.

7. The circuitry of claim 1, wherein the predetermined voltage level is in a range between 2 volts and 2.5 volts.

8. A circuitry in a nonvolatile memory for detecting a potential level of a power supply applied to the nonvolatile memory and for generating a reset signal to reset resettable circuitry in the nonvolatile memory until the potential level of the power supply rises above a predetermined level, comprising:

(A) a first transistor having a first end coupled to receive the power supply, a second end coupled to a first node, and a third end coupled to the power supply;

(B) a second transistor having a first end decoupled to the first node, a second end coupled to ground, and a third end coupled to the first node, wherein the first and second transistors function as a voltage divider;

(C) a third transistor having a first end coupled to an output node, a second end coupled to the ground, a third end coupled to the first node; and (D) resistor means coupled between the output node and the power supply for providing a positive potential at the output node when the third transistor is not conducting, wherein when the powers supply has not reached the predetermined level, the third transistor is not conducting and the output node outputs the reset signal that is the positive potential, wherein when the power supply rises above the predetermined level, the third transistor starts to conduct and the output node registers a ground potential and ceases to output the reset signal, wherein the first, second, and third transistors are of the same channel type such that the circuitry operates substantially independent of process variation and temperature variation.

9. The circuitry of claim 8, wherein each of the first, second, and third transistors has a threshold voltage of approximately one volt.

10. The circuitry of claim 9, wherein the threshold voltage of each of the first, second, and third transistors can be changed.

11. The circuitry of claim 8, wherein the first, second, and third transistors are N-channel transistors.

12. The circuitry of claim 8, further comprising an inverter coupled to the output node.

13. The circuitry of claim 8, wherein the resistor means comprises a diffusion resistor.

14. The circuitry of claim 8, wherein the predetermined level is in a range between 2 volts and 2.5 volts.

15. The nonvolatile memory of claim 8, wherein the nonvolatile memory is electrically programmable and electrically erasable.

16. A computer system, comprising:
(A) a system bus;
(B) a central processing unit (CPU) coupled to the system bus;
(C) a plurality of peripheral devices, each of which being coupled to the system bus;
(D) a nonvolatile memory coupled to system bus, wherein the nonvolatile memory further comprises
(i) a memory array;
(ii) a control circuitry coupled to the memory array for controlling operations of the memory array; and
(iii) a detection circuit coupled to the control circuitry and coupled to receive a power supply for detecting potential level of the power supply and for generating a reset signal to reset the control circuitry until the potential level of the power supply rises above a predetermined voltage, wherein the detection circuit further comprises
(1) a first transistor having a first end coupled to receive the power supply, a second end coupled to a first node, and a third end coupled to the first node;
(2) a second transistor having a first end coupled to the first node, a second end couple to ground, and a third end coupled to the ground, wherein the first and second transistors function as a voltage divider;
(3) a third transistor having a first end coupled to the power supply, a second end coupled to an output node, a third end coupled to the first node; and
(4) resistor means coupled between the output node and the ground for coupling the output node to the ground when the third transistor is not conducting, and for providing a positive potential at the output node when the third transistor is conducting, wherein when the power supply does not reach the predetermined voltage level, the third transistor is not conducting and the output node outputs the reset signal that is a ground potential, wherein when the power supply rises above the predetermined voltage level, the third transistor starts to conduct and the output node registers the positive potential and ceases to output the reset signal, wherein the first, second, and third transistor are of the same channel type such that the circuitry operates independent of process variation and temperature variation.

17. The computer system of claim 16, wherein each of the first, second, and third transistors has a threshold voltage of approximately one volt.

18. The computer system of claim 16, wherein the first, second, and third transistors are P-channel transistors.

19. The computer system of claim 16, wherein the predetermined voltage level can be changed by changing size ratio of the first and second transistors.

20. The computer system of claim 16, wherein the resistor means comprises a diffusion resistor.

21. The computer system of claim 16, wherein the predetermined voltage level is in a range between 2 volts and 2.5 volts.

22. The computer system of claim 16, wherein the nonvolatile memory is electrically programmable and electrically erasable.

* * * * *

UNITED STATES PATENT AND TRADEMARK OFFICE
CERTIFICATE OF CORRECTION

PATENT NO. : 5,301,161
DATED : April 5, 1994
INVENTOR(S) : Landgraf et al.

It is certified that error appears in the above-indentified patent and that said Letters Patent is hereby corrected as shown below:

Column 1; Line 34; Following "EPROM", insert--. Data corruption arises from programming erased memory cells or erasing programmed memory cells. Physical damage to the prior flash EPROM--.
Column 8; Line 15; After "the", insert --trip--.

Signed and Sealed this

Thirty-first Day of October 1995

Attest:

BRUCE LEHMAN

Attesting Officer    Commissioner of Patents and Trademarks